United States Patent [19]

Galyon et al.

[11] Patent Number: 5,016,090

[45] Date of Patent: May 14, 1991

[54] CROSS-HATCH FLOW DISTRIBUTION AND APPLICATIONS THEREOF

[75] Inventors: George T. Galyon, Fishkill; George M. Jordhamo; Kevin P. Moran, both of Wappingers Falls; Michael L. Zumbrunnen, Poughkeepsie, all of N.Y.

[73] Assignee: International Business Machines Corporation, Armonk, N.Y.

[21] Appl. No.: 496,838

[22] Filed: Mar. 21, 1990

[51] Int. Cl.$^5$ .................... H02B 1/00; G06F 1/00; H01L 23/46
[52] U.S. Cl. .................................................. 357/82
[58] Field of Search ................................. 357/82, 81

[56] References Cited

U.S. PATENT DOCUMENTS

| 4,138,692 | 2/1979 | Meeker | 357/82 |
| 4,361,334 | 11/1982 | Amoresi et al. | 277/16 |
| 4,494,171 | 11/1985 | Bland et al. | 361/355 |
| 4,504,156 | 3/1985 | Currie et al. | 351/28 |
| 4,561,040 | 12/1985 | Eastman | 361/385 |
| 4,685,211 | 8/1987 | Hagihara et al. | 357/82 |
| 4,694,323 | 9/1987 | Itahana | 357/82 |
| 4,748,495 | 5/1988 | Kucharek | 361/382 |
| 4,758,926 | 7/1988 | Herrell et al. | 361/385 |
| 4,800,956 | 1/1989 | Hamburgen | 351/81 |
| 4,809,134 | 2/1989 | Tustaniwskyj et al. | 361/385 |
| 4,893,174 | 1/1990 | Yamada et al. | 357/82 |

FOREIGN PATENT DOCUMENTS

| 0196863 | 10/1986 | European Pat. Off. | 351/82 |
| 58-114215 | 7/1983 | Japan | 361/385 |
| 59-193053 | 11/1984 | Japan | 351/81 |

OTHER PUBLICATIONS

Chu, "Counter-Flow Cooling System", IBM TDB, vol. 8, No. 11, Apr. 1966, p. 1692.
Pascuzzo et al., "Integrated Circuit Module Package Cooling Structure", IBM TDB, vol. 20, No. 10, Mar./78, pp. 3898-3899.
IBM Technical Disclosure Bulletin, vol. 29, No. 12, May 1987, p. 5200 entitled, "Isothermal Cold Plate . . . Array", by G. M. Chrysler et al.
IBM Technical Disclosure Bulletin, vol. 29, No. 7, Dec. 1986, p. 2887, entitled "Liquid Cooled Circuit Package With Jet . . . From the Jet", by W. Antonetti et al.
IBM Technical Disclosure Bulletin, vol. 29, No. 2, Jul. 1986, p. 689, entitled "Cold Plate For Thermal Conduction Module With . . . Turbulence", by U. P. Hwang.
IBM Technical Disclosure Bulletin, vol. 29, No. 2, Jul. 1986, p. 671, Entitled: "TCM Cold Plate With Chilled . . . Periphery", by U. P. Hwang et al.
IBM Technical Disclosure Bulletin, vol. 28, No. 7, Dec. 1985, Entitled "Cold Plate For Thermal Conduction Module . . . Water Flow", by V. Antonetti et al., p. 3198.
IBM Technical Disclosure Bulletin, vol. 128, No. 3, Aug. 1985, Entitled "TCM Cold Plate With . . . Manifold", by R. C. Chu, pp. 1304/1305.

Primary Examiner—Andrew J. James
Assistant Examiner—Viet Q. Nguyen
Attorney, Agent, or Firm—Richard M. Ludwin

[57] ABSTRACT

A cold plate and an integrated circuit cooling module embodying a cross-hatch coolant flow distribution scheme. Cross hatch flow distribution is achieved by way of two sets of channels which run perpendicular to each other. The first set of channels is formed on a base plate. The second, perpendicular set is includes a set of inlet channels and a set of interleaved outlet channels formed on a distribution plate. In the preferred embodiment, the base and distribution plates are separated by an interposer plate that has nozzles which cause a liquid coolant to impinge, under pressure, on the floor of the base plate.

16 Claims, 14 Drawing Sheets

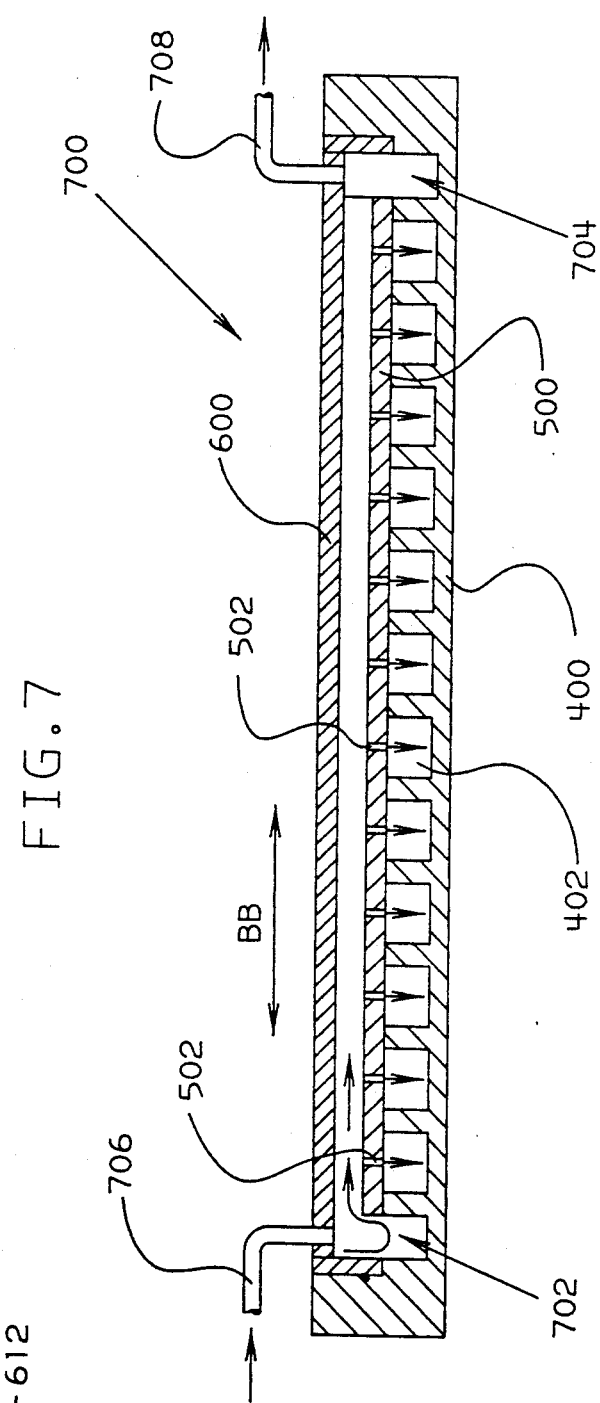
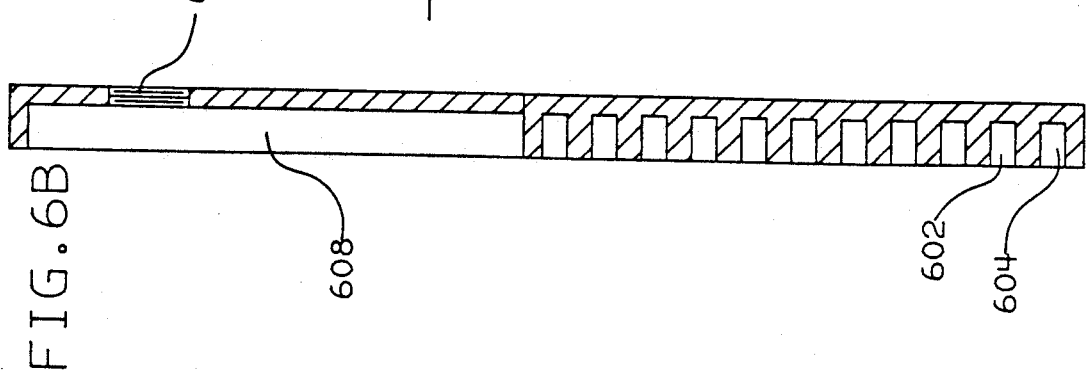

1306
1304
1302

CROSS-HATCH FLOW DISTRIBUTION AND APPLICATIONS THEREOF

BACKGROUND OF THE INVENTION a. Field of the Invention

This invention relates to liquid cooled semiconductor modules.

b. Related Art

Cooling of integrated circuit chips in large computers is often accomplished placing the chips in a number of liquid cooled modules. FIG. 1 shows a cross-sectional view of a prior art thermal conduction module 10 for providing cooling of the integrated circuit chips 12 contained therein. As is well known, the power consumed in the circuits within the chips 12 generates heat which must be removed. The chips 12 may have different power requirements and different ranges of operating temperatures. Thus, in order to obtain reliable operation of the integrated circuits, the cooling must be of such character as to maintain the temperature of each chip within its required operating range.

The chips 12 are mounted (by way of solder balls 28) on one side of a substrate 14, generally made of ceramic, which has pins 16 extending from the other side thereof. These connecting pins 16 provide for the plugging of the module into a board (not shown) which may carry auxiliary circuits, etc. A housing or cap 18 is attached to the substrate 14 by means of a flange 20 which extends from the periphery of the substrate 14 to the cap 18. The cap 18 is made of a good heat conductive material such as copper or aluminum. The cap has small cylindrical openings 22 located therein, which are arranged in a matrix directly adjacent to the exposed surface of each chip 12.

Each of the openings 22 receives a spring loaded pin piston 24. Each piston 24 has a square header 26 which contacts the chip surface. Heat generated by the chips 12 is carried away by the pistons 24 to the cap 18. A cold plate 30, attached to or designed as an integral part of the cap 18, transfers the heat to a stream of coolant (for example chilled water) which flows from an inlet 32 to an outlet 34. The coolant carries the heat away from the thermal conduction module assembly 10.

As the power consumption of integrated chips has increased, the amount of heat which needs to removed from the chips and the thermal conduction module has increased as well. Since the ability of the thermal conduction module to remove heat from the chips is dependant on the ability of the cold plate to remove heat from the pistons and the TCM cap, a great deal of design effort has been put into developing an efficient cold plate design.

FIG. 2 shows a top-cutaway view of a prior art cold plate 200 having a serpentine coolant flow path 202 between an inlet 203 and an outlet 204. A number of bolt holes 205 are provided for attaching the cold plate to the cap of a thermal conduction module. One limitation of the cold plate of FIG. 2 is that the serpentine coolant flow path is generally serial. Thus, a single stream of coolant carries away heat from the chips as it passes over the pistons on its way from the inlet 203 to the outlet 204. Given such a serial flow path, in order to properly cool chips having higher power dissipations the rate of water flow must substantially be increased.

Increasing the flow rate to accommodate chips with high power dissipations can prove to be a difficult and costly exercise. In order to accomplish an increase of flow rate by a factor of X, the pressure drop between the inlet and the outlet of the TCM must be increased by X squared. Increases in pressure can be costly in several respects. For example, increasing coolant pressure typically requires larger and more expensive compression/cooling units. Further, suitable fittings and coolant supply tubing (typically more expensive) must be provided to accommodate the higher pressures.

Another problem with serial flow paths is that as the length of the path increases the required pressure drop must also be increased in proportional relationship to maintain a given flow rate. Thus, if the substrate to be cooled becomes larger, or the number of rows of integrated circuits on a given sized substrate increases, the longer flow path will cause a proportional increase in the required pressure drop.

FIG. 3 shows an example of another prior art cold plate 300 that uses fins for improved heat transfer. Four fins 302 extend from two opposite walls of the cold plate to form a sinuous path for water flow. Each parallel segment of the path is relatively wide and is further divided into four parallel channels by a three by three parallel line of short fins 304. The gaps between the short fins increase the turbulence in the water flow. The parallel channels provide increased fin area with lower flow resistance. While the embodiment of FIG. 3 is an improvement over that of FIG. 2, the coolant is still forced to flow along an essentially serial path over the pins of the TCM. Further, as the number of fins is increased the pressure drop required to maintain sufficient cooling is increased as well.

SUMMARY OF THE INVENTION

It is an object of the invention to remove heat from integrated circuits having high power dissipations, using a liquid coolant flowing at an inlet to outlet pressure drop superior to that accomplished by the prior art.

It is a further object of the invention to remove heat from integrated circuits having high power dissipations by providing an indirect impingement cooling scheme which removes heat more efficiently than those found in the prior art.

In accordance with these objects there is provided, in a first embodiment of the invention, a cold plate having a cross-hatch flow distribution scheme comprising two sets of nonplaner channels which are disposed angularly to each other. The first set of channels is formed on a base plate while the second, set is formed on a distribution plate. In the preferred embodiment, the base and distribution plates are separated by an interposer to improve and customize cold plate performance.

In a second embodiment of the invention, there is provided a heat removal apparatus, including a body having a top portion, a central portion and a bottom portion. The top portion includes a plurality of coolant inlet channels interleaved with plurality of coolant outlet channels. The bottom portion includes a plurality of cooling plugs connected to the body by way of a plurality of compliant members. The central portion includes a plurality of nozzles which extend from the inlet channels, into the cooling plugs, so as to cause a liquid coolant in the inlet channels to impinge onto the plugs.

BRIEF DESCRIPTION OF THE DRAWINGS

FIG. 6B is a side cutaway view of the distribution plate of FIG. 6A taken along line 6B.

FIG. 7 is a side cutaway view of an assembled cold plate incorporating cross hatch flow distribution, showing the base, interposer and distribution plates of FIGS. 4A-B, 5 and 6A-B.

Like components appearing in more than one Figure have been assigned like reference numerals.

DETAILED DESCRIPTION OF THE PREFERRED EMBODIMENTS

Figure 1:
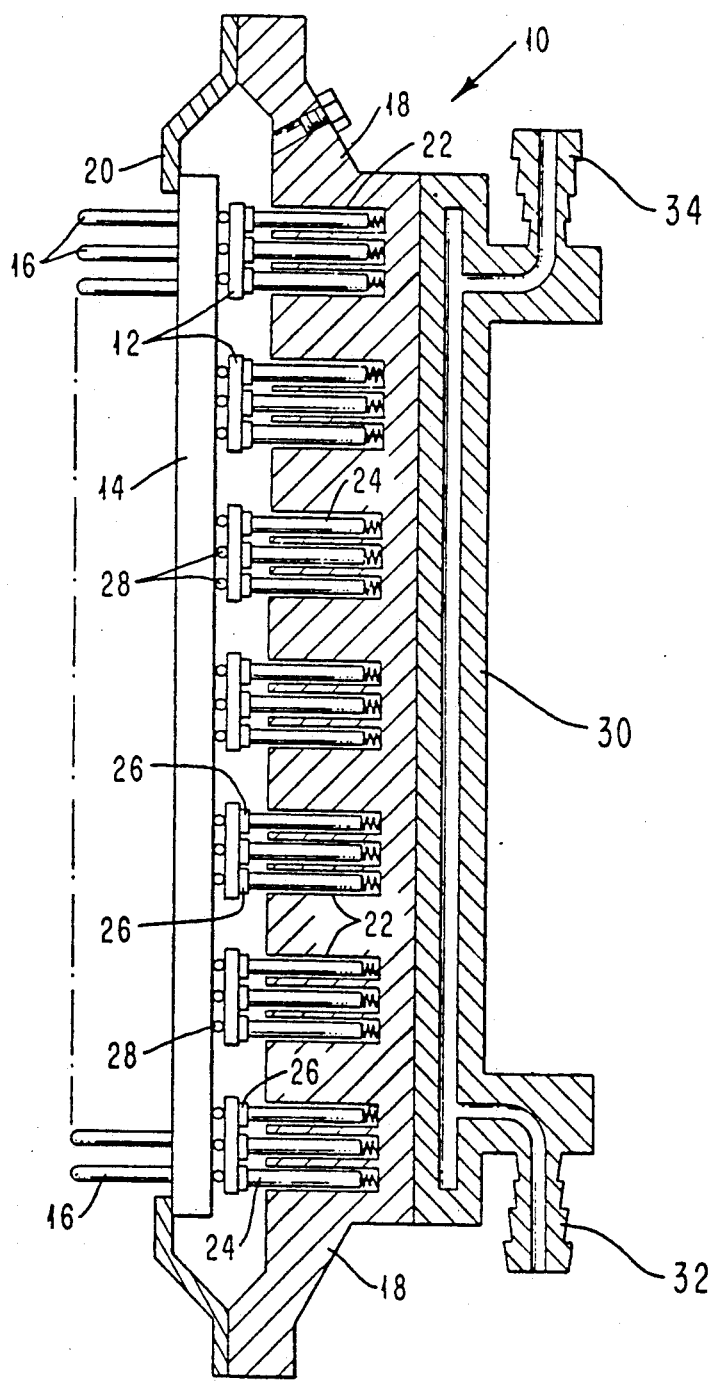
FIG. 1 is a cutaway view of a prior art thermal conduction module.
Figure 2:
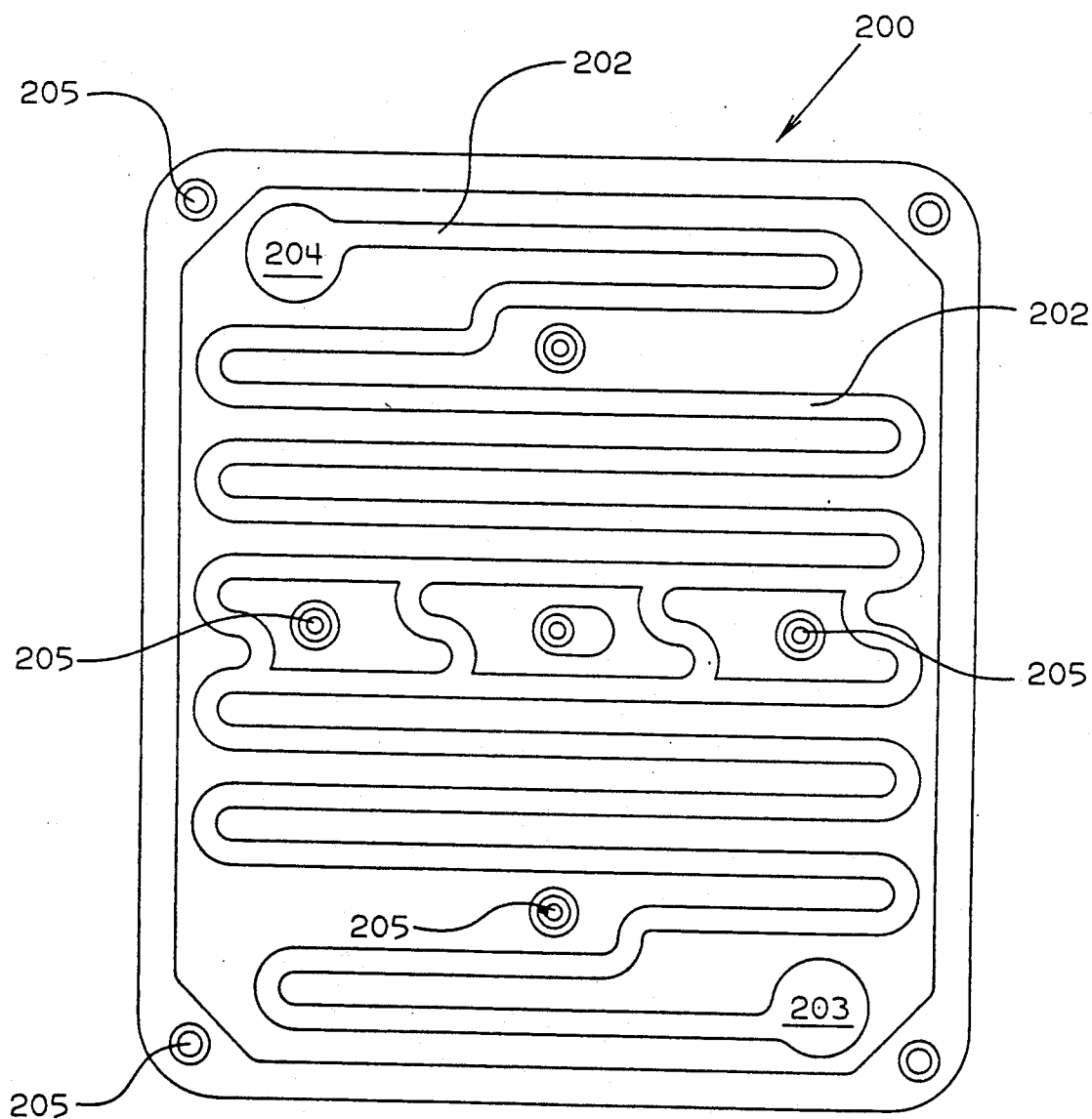
FIG. 2 is a top cutaway view of a prior art cold plate having a serpentine flow path.
Figure 3:
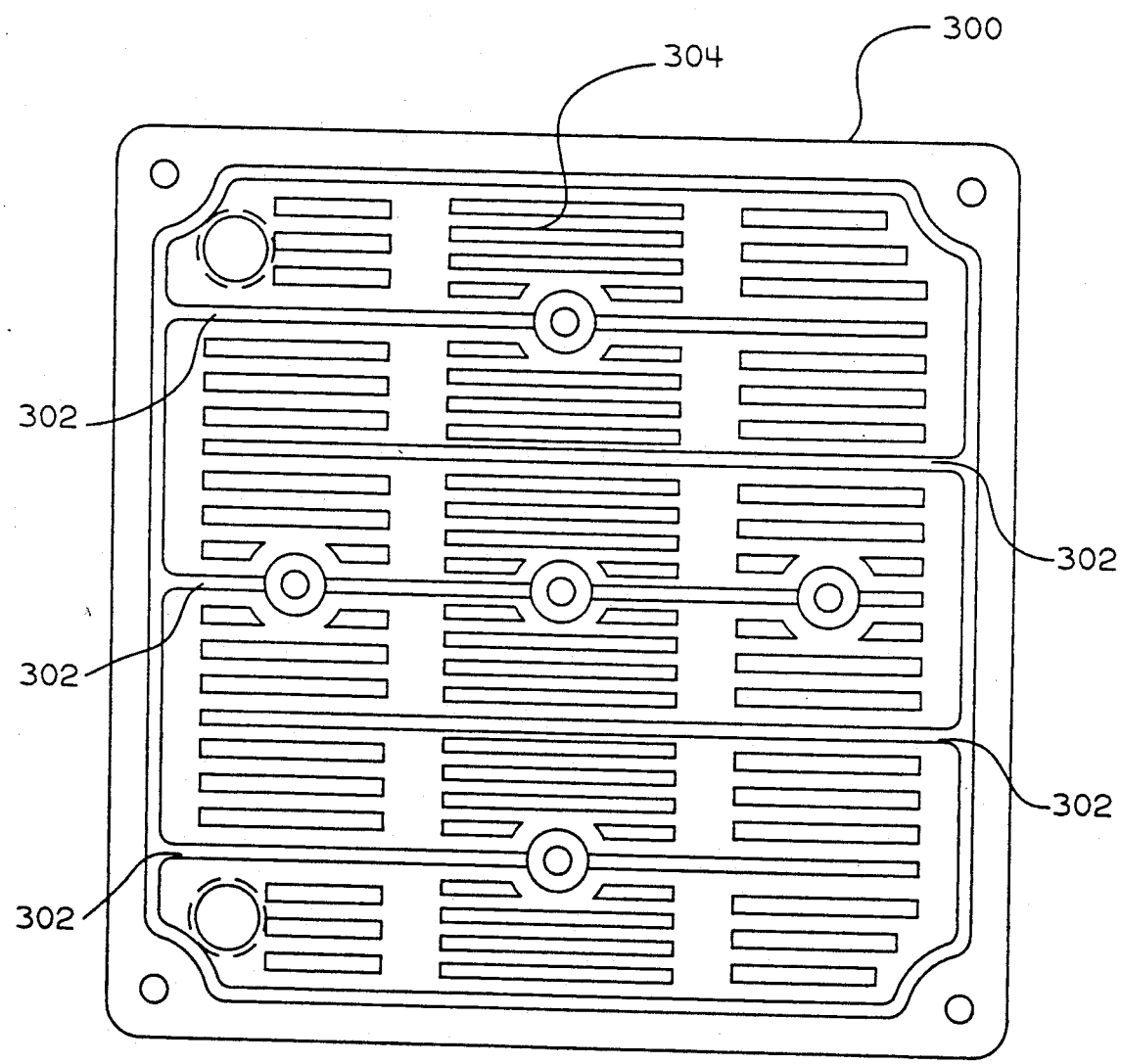
FIG. 3 is a top cutaway view of a prior art cold plate having fins and a serpentine flow path.

The cross-hatch flow distribution scheme comprises two sets of channels which run perpendicular to each other. A first set of channels is formed on a base plate (FIGS. 4A-B) while a second, perpendicular set is formed on a distribution plate (FIGS. 6A-B). The base and distribution plates can be separated by an interposer (FIG. 5) to customize and improve performance.

FIG. 7 is a side cutaway view of an assembled cold plate incorporating cross hatch flow distribution, showing the base 400, interposer 500 and distribution 600 plates of FIGS. 4A-B, 5 and 6A-B. As illustrated in FIG. 7, rectangular openings in the base, interposer and distribution plates cooperate to form an inlet manifold chamber 702 and and outlet manifold chamber 704. An inlet 706 is connected to supply coolant to the inlet manifold chamber 702 while an outlet 708 is connected to carry away coolant from the outlet manifold chamber 704.

The distribution plate 600 preferably comprises a block of copper into which a series of interleaved parallel channels (shown in FIG, 6A, 6B) have been machined. In the orientation illustrated in FIG, 7, the distribution plate channels would run in the directions indicated by arrows BB.

The base plate 400 also preferably comprises a block of copper into which a series of parallel channels 402 have been machined. The channels 402 in the base plate 400 are oriented perpendicularly to the channels in the distribution plate 600.

In the embodiment of FIG. 7, the interposer 500 is sandwiched in between the base and distribution plates 400, 600. The interposer 500 preferably comprises a thin copper sheet into which a series of holes and rectangular openings have been machined (respectively 502, 504 of FIG. 5). The holes are arranged into lines which are interleaved with the openings. The lines of holes and the openings are parallel to each other and run in the direction of arrows BB in the orientation of the cold plate illustrated in FIG. 7. In the assembled cold plate 700 the lines of holes run perpendicularly to the base plate channels 402. Each hole 502 in a given line is centered above one of the base plate channels 402.

Figure 4A:
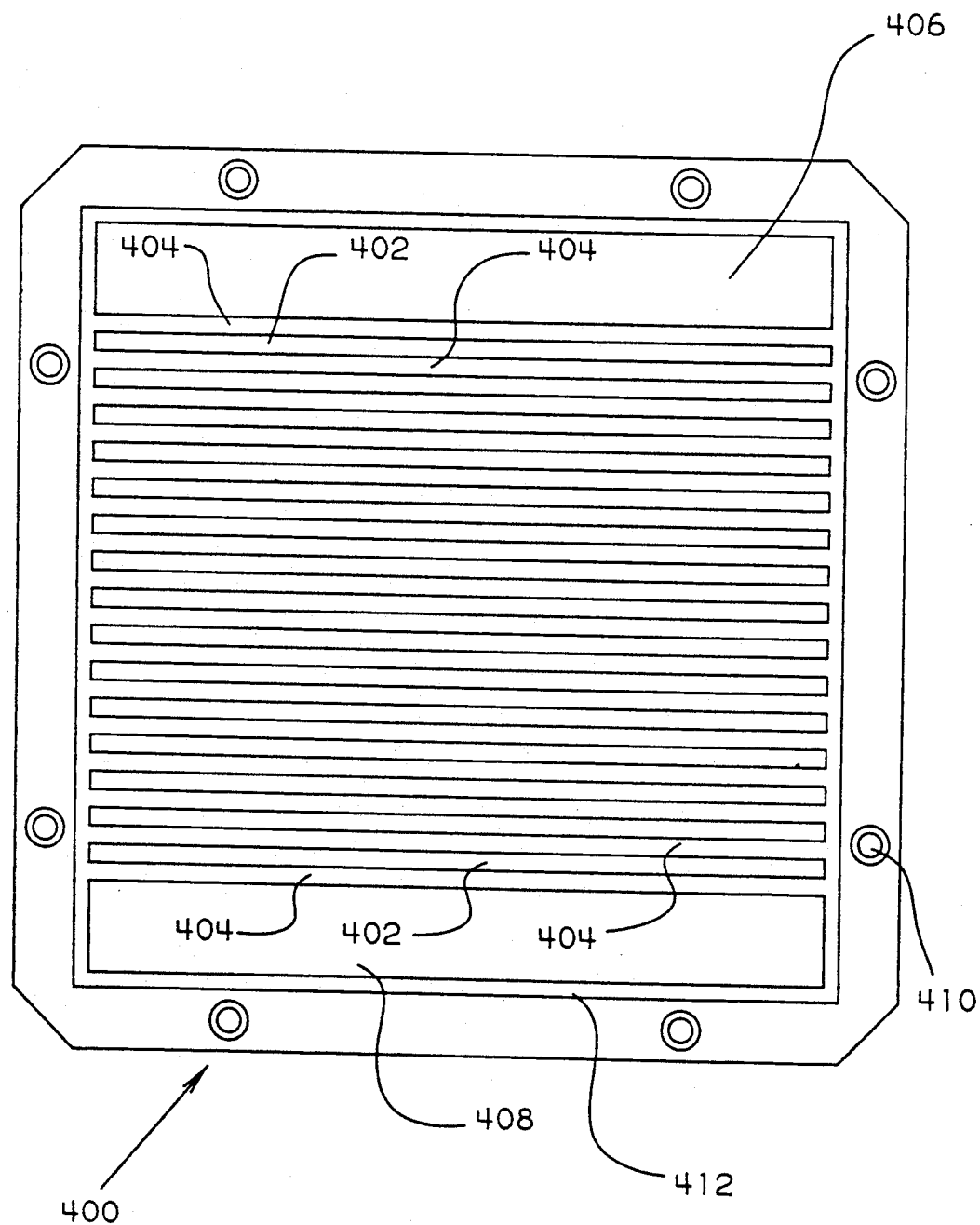
FIG. 4A is a top view of a base plate according to a preferred embodiment of the present invention.

Turning now to FIG. 4A, the base plate 400 (FIG. 4A) comprises a solid block of copper into which channels 402 have been machined. Each channel is separated from its adjacent channel by a solid wall 404. The channel depth can be varied depending upon the performance desired. At opposite ends of the base plate are two large channels 406, 408 which serve as the lower portions of the manifold chambers 702,704 in the assembled cold plate (FIG. 7). A series of through-holes 410 around the perimeter of the base plate serve as locators for mounting screws. The pitch of the base channels 402 (i.e the distance between adjacent channels) as well as the number/width of channels can be varied depending on the performance desired. A ledge 412 around the perimeter of the base channels serves as a platform to support the interposer and distribution channel cover.

Figure 4B:
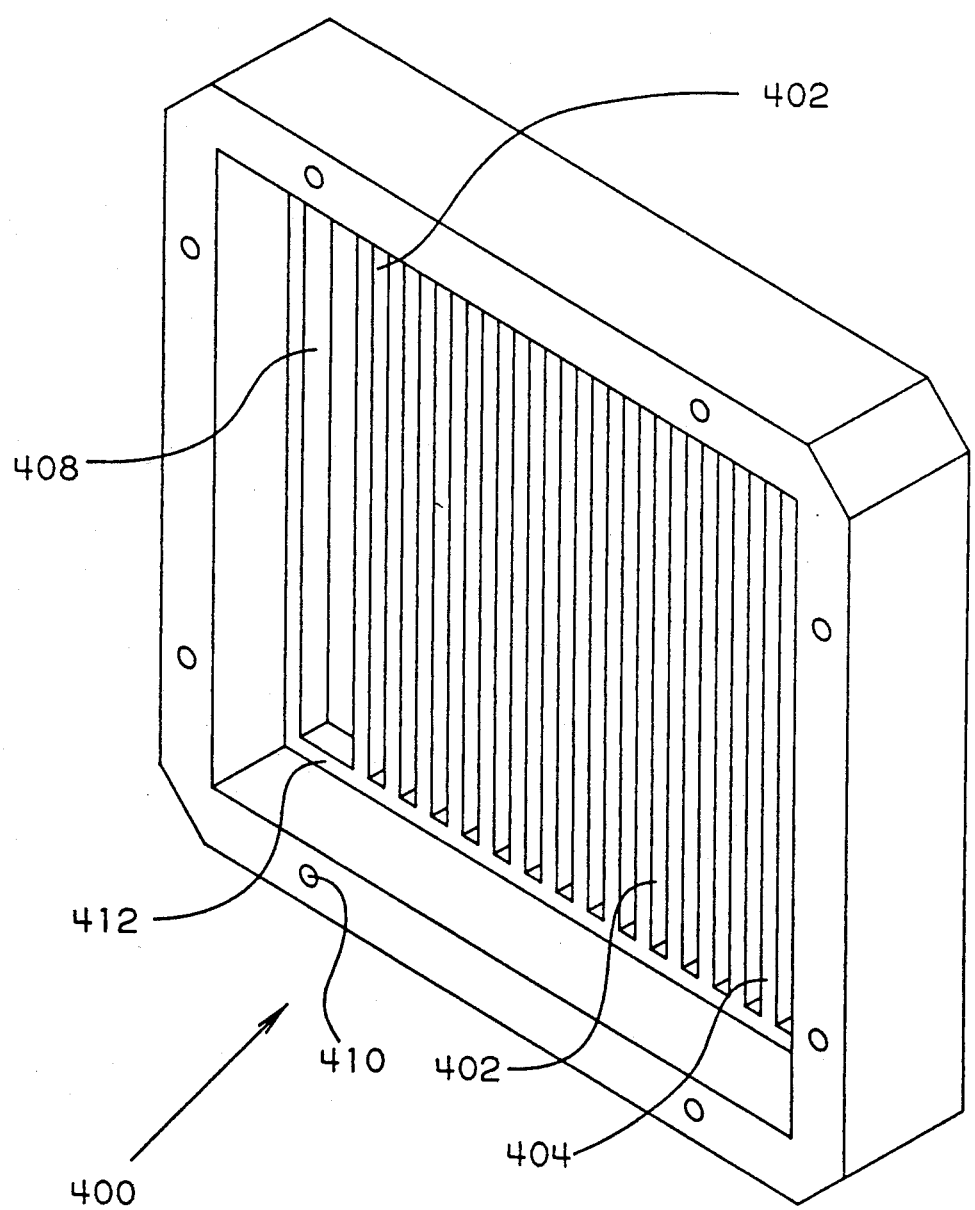
FIG. 4B is an isometric view of the base plate of FIG. 4A.

An isometric view of the base plate is illustrated in FIG. 4B. As illustrated in FIG. 4B, the base plate 400 has a rectangular opening of sufficient depth to support the interposer (which rests on the ledge 412) and the distribution plate (which fits snugly against the interposer).

In the embodiment of FIGS. 4A, 4B there are 15 channels. Exemplary measurements for the embodiment of FIGS. 4A, 4B are listed in table 1—1 below.

Figure 5:
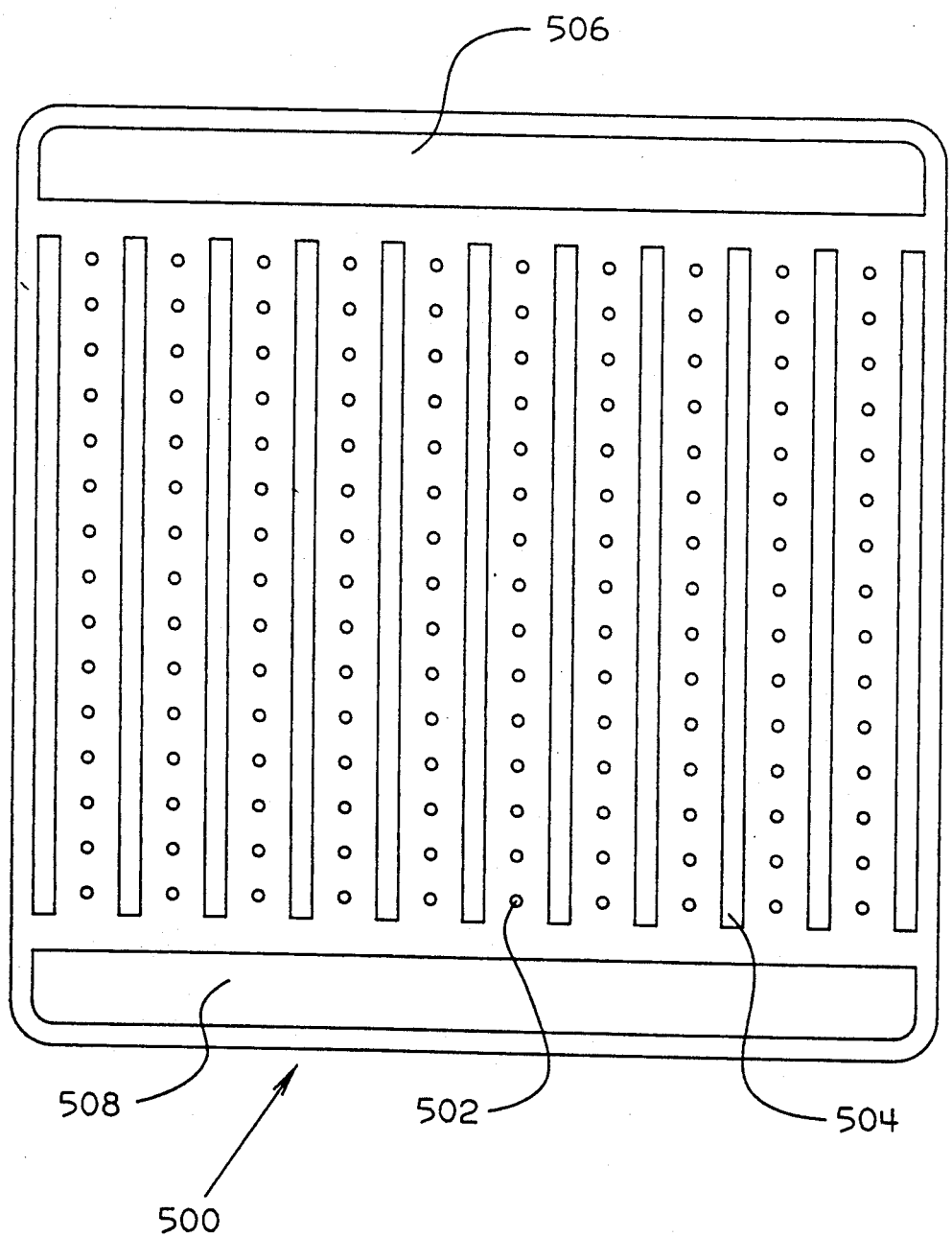
FIG. 5 is a top view of an interposer plate according to a preferred embodiment of the present invention.
Figure 6A:
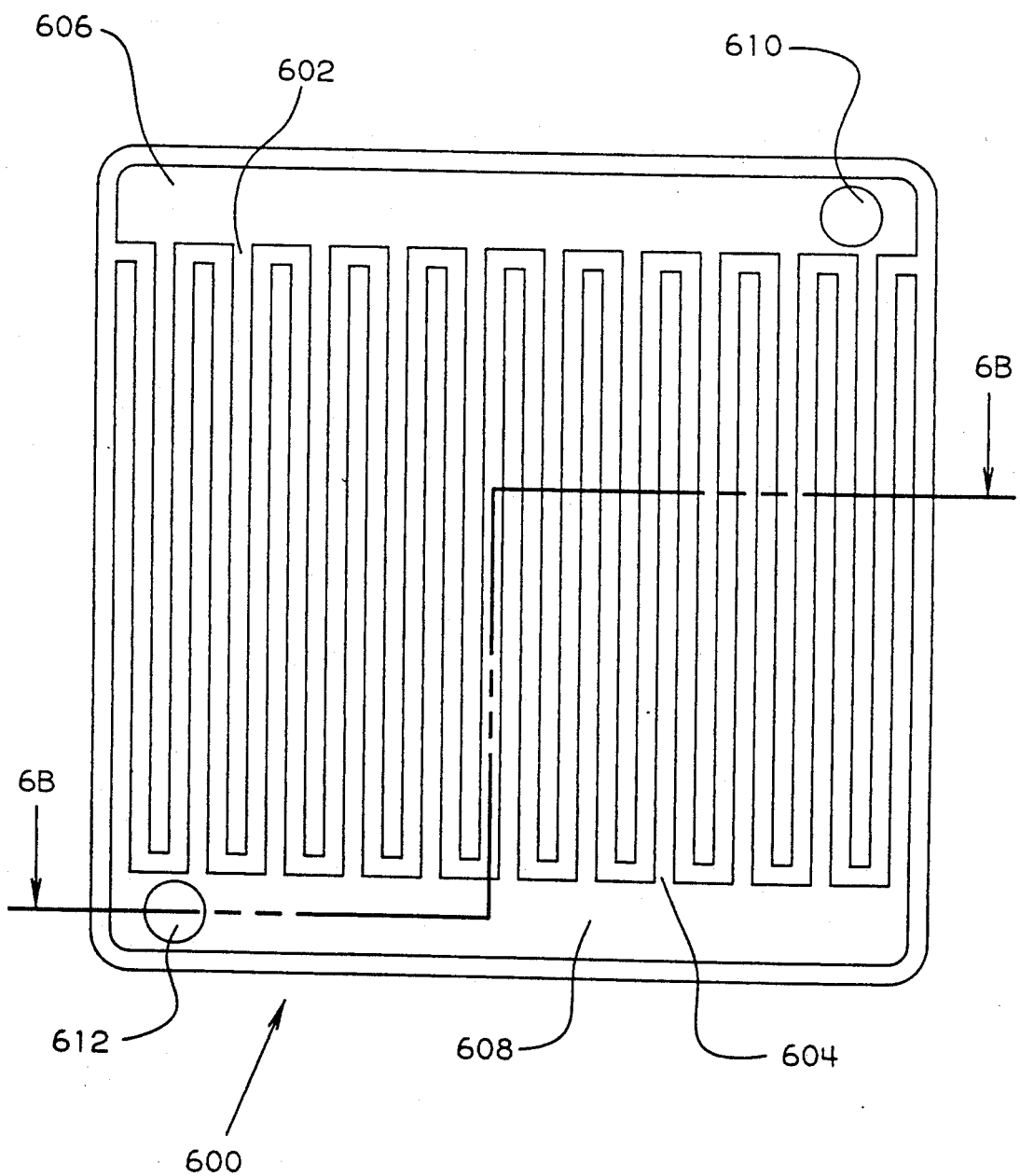
FIG. 6A is a top cutaway view of a distribution plate according to a preferred embodiment of the present invention.

TABLE 1—1 a. width of the channels 402: 2.6 mm
b. width of separating walls 404: 2.6 mm
c. pitch (a+b): 5.2 mm
d. width of ledge 412: 2.0 mm
e. depth of channels 402: 3.1 mm Turning now to FIG. 5, the interposer plate 500 comprises a thin Copper sheet (approximately 0.5 mm) into which a series of holes 502 and rectangular openings 504 have been machined. The holes 502 act as nozzles, increasing the velocity of the water as it travels through. The hole diameter, geometry, and density can be varied depending on the performance desired. An exemplary hole would be circular and have a diameter of 0.7 mm. The holes are located so that they are centered above the base channels which would be situated below when the interposer plate is mounted to the base plate.

The long, slender rectangular openings 504 which lie between rows of holes are perpendicularly located above a base channel situated below. The rectangular openings enable water which has entered the base channels to exit through the base plate to the outlet manifold chamber. Alternatively, small holes or other openings could be used in place of the rectangular openings 504. An exemplary size for the rectangular openings is 2.47 mm by 75.8 mm. The two large rectangular openings 506, 508 cooperate with similar openings in the base and distributions plates to form the manifold chambers in the assembled cold plate 700 (FIG. 7).

Turning now to FIG. 6A, the distribution/cover plate 600 comprises a block of Copper into which a series of channels has been machined. Two sets of channels are machined into the plate; a set of inlet channels 602 and a set of outlet channels 604. The inlet and outlet channels are interleaved and independent of each other (i.e. they do not connect to each other on the distribution plate). The inlet channels (10 of them in the embodiment of FIGS. 6A-B) connect to a rectangular inlet manifold opening 606 which cooperates with similar openings 406, 506 in the base and interposer plates to form the inlet manifold chamber 702 in the assembled cold plate 700 (FIG. 7). The outlet channels (11 of them in the embodiment of FIGS. 6A-B) connect to an rectangular outlet manifold opening 608 which cooperates with similar openings 408, 508 in the base and interposer plates to form the outlet manifold chamber 704 in the assembled cold plate 700 (FIG. 7). The depth of the inlet and/or outlet channels can vary such that the channel depth is greatest adjacent to the manifold chamber and shallowest at the channel termination point, thereby providing constant coolant velocity along the length of the channels.

The inlet channels are laid out such that when the cover is placed on top of the interposer, the inlet channels will be centered over the interposer nozzle holes. Likewise, the outlet channels will be centered over the rectangular outlet openings on the interposer. The pitch and number of inlet and outlet openings can be varied depending on the performance desired. The inlet and outlet manifold chambers include tapped holes 610, 612 for fittings. The width of the inlet/outlet channels and the width of the walls separating the inlet and outlet channels are preferably the same as width of the base plate channels 402 and separating walls 404, respectively. Given the examplary measurements of TABLE 1—1, a preferable depth of the inlet/outlet channels is 5.4 mm.

As an alternative to the embodiment of FIG. 6A, the inlet channels can be machined from the opposite face of the distribution plate and the interposer plate nozzles can be incorporated into the distribution plate by forming nozzle holes in the inlet channels 602. In this alternative embodiment, the rectangular manifold openings 606, 608 cooperate with similar openings in the base plate 400. A cover plate seals the inlet channels from the external environment and the coolant flows through the nozzle holes in the distribution plate and impinges on the bottom of the channels in the base plate 400. When such an embodiment of the distribution plate is used, the interposer plate 500 is not required in the assembled cold plate.

The coolant flow scheme in the module of FIG. 7 will now be explained by reference to FIGS. 4A-7. The coolant (represented by arrows in FIG. 7) enters the inlet 706 and charges the inlet manifold chamber 702. The coolant flows through the inlet channels 602 and is forced down through the nozzles 502 of the interposer 500. The coolant then impinges at the bottom of the base plate 400. After impinging at the bottom of the base plate, a portion of the coolant fluid turns outwardly (to the right in FIG. 4A) and the remaining portion turns inwardly (to the left in FIG. 4A) in the base channels 402 to become parallel with the base channel walls 404. The fluid continues along the base channels until it collides with coolant originating from adjacent nozzles. The combined and mixed coolant then turns upward and passes through the rectangular openings 504 (FIG. 5) in the interposer 500 and reaches the outlet channels 604 in the distribution/cover plate 600. The coolant flow continues through the outlet channels 604 and charges the outlet manifold chamber 704. The coolant then exhausts through the outlet 708.

Figure 11:
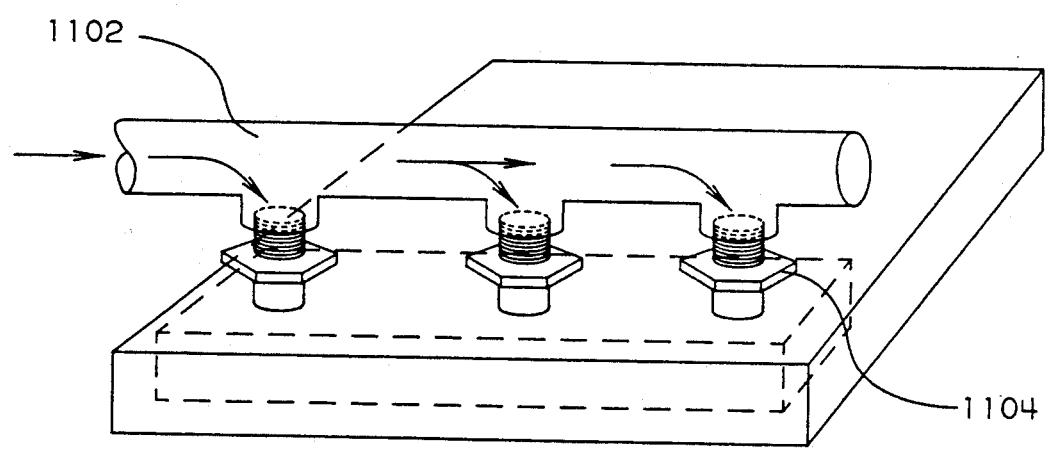
FIG. 11 illustrates a manifold having multiple fittings.
Figure 12:
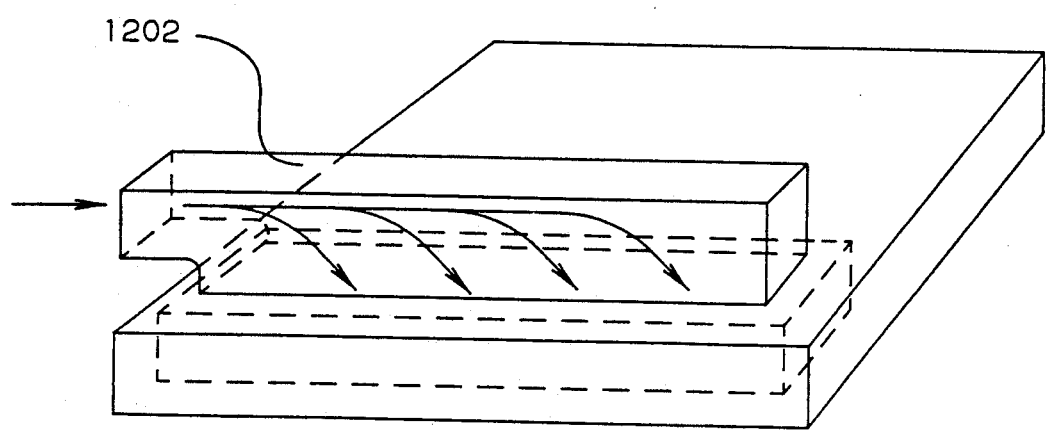
FIG. 12 illustrates a manifold having a single large opening as a fitting.

Although conventional manifolds having single inlet an outlet fittings can be used in conjunction with the cold plate of FIG. 7, the inlet and outlet manifolds can be adapted to have multiple fittings. FIG. 11 illustrates an embodiment of the present cold plate having a manifold 1102 with multiple fittings 1104. The embodiment of FIG. 11 reduces the pressure drop penalty (as compared with a single fitting manifold) since much of the pressure drop is across the fittings. As a further alternative embodiment, a manifold 1202 having a single large fitting (i.e. the opening is a large as the manifold chamber) can be utilized as illustrated in FIG. 12.

The cross hatch cold plate of FIG. 7 is assembled using a brazing process. The interposer is placed into the base; braze filler metal is added followed by the distribution/cover piece and addition braze filler. The entire assembly is then heated to brazing temperatures.

Figure 13A:
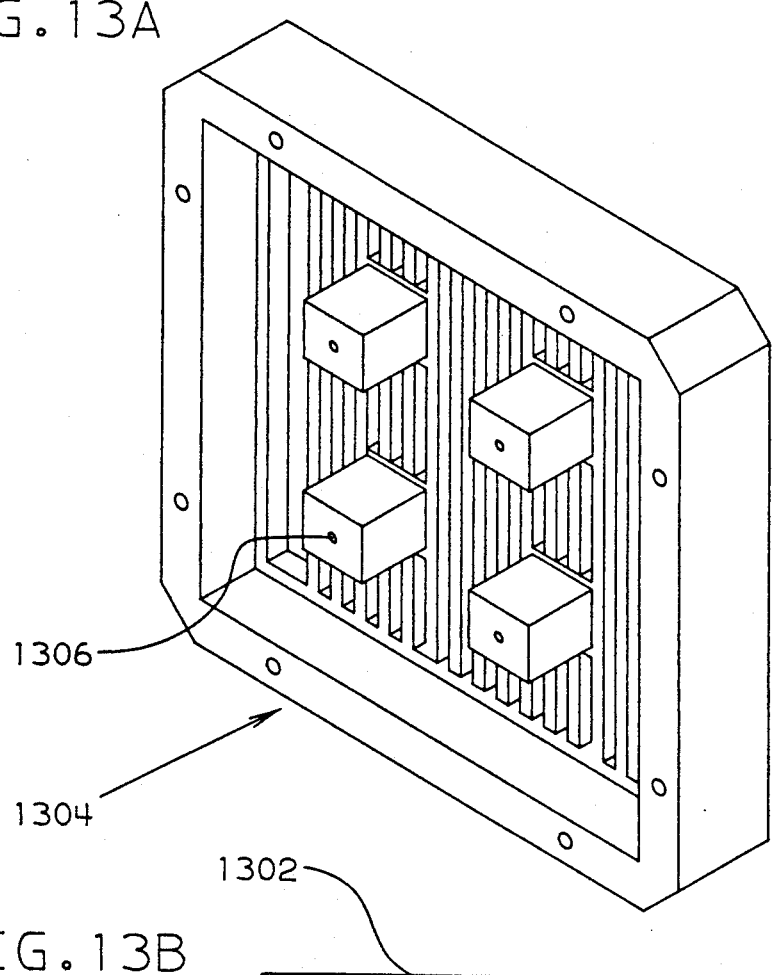
FIGS. 13A and 13B illustrate, respectively, an embodiment of a base and interposer plate using internal bosses for separable cold plate attachment to a integrated circuit cooling module.
Figure 13B:
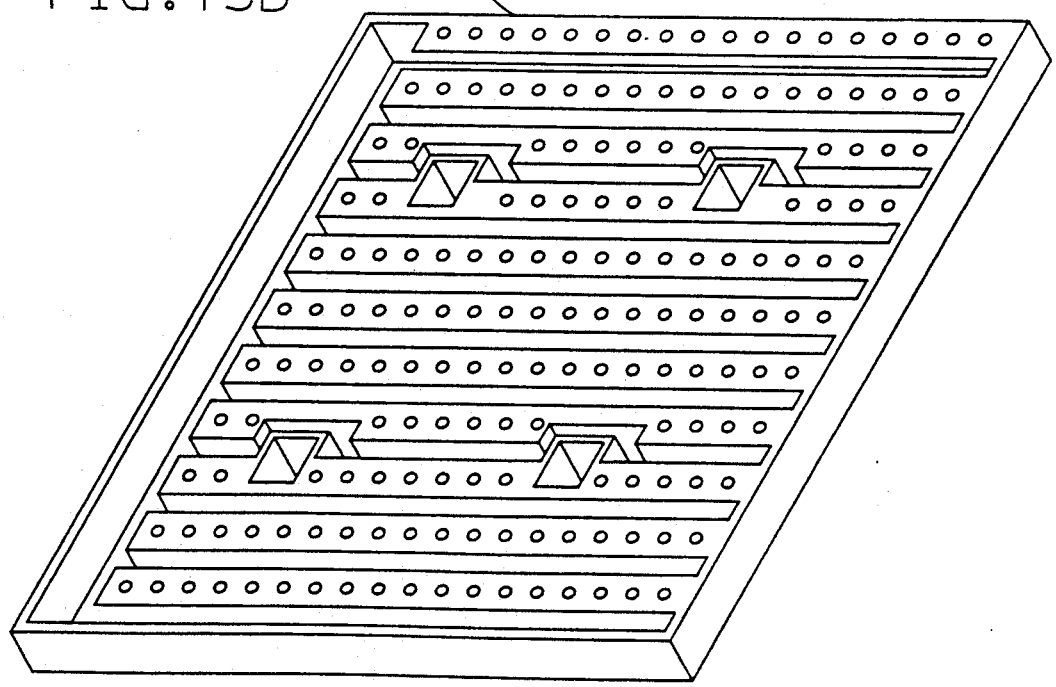

FIGS. 13A and 13B illustrate an alternative, albeit less preferable, embodiment of a base and interposer plate using bosses for internal attachment. In the embodiment of FIGS. 13A, 13B the interposer plate 1302 is placed over the base plate 1304. The assembled cold plate is then attached to a semiconductor cooling module by way of threaded screw holes 1306.

Advantageously, the interposer plate can be modified to adjust and optimize the performance of the cold plate. For example, in the cold plate of FIG. 7, the optimum impingement distance between the interposer and the floor of the base plate channels (given the exemplary dimensions listed above) is 3.1 mm. One way of achieving this optimum would be to use standard circular holes in the interposer plate and a channel height of 3.1 mm in the base plate. However, increasing the height of the channels in the base plate can also add to performance by creating an extended cooling surface.

Figure 14:
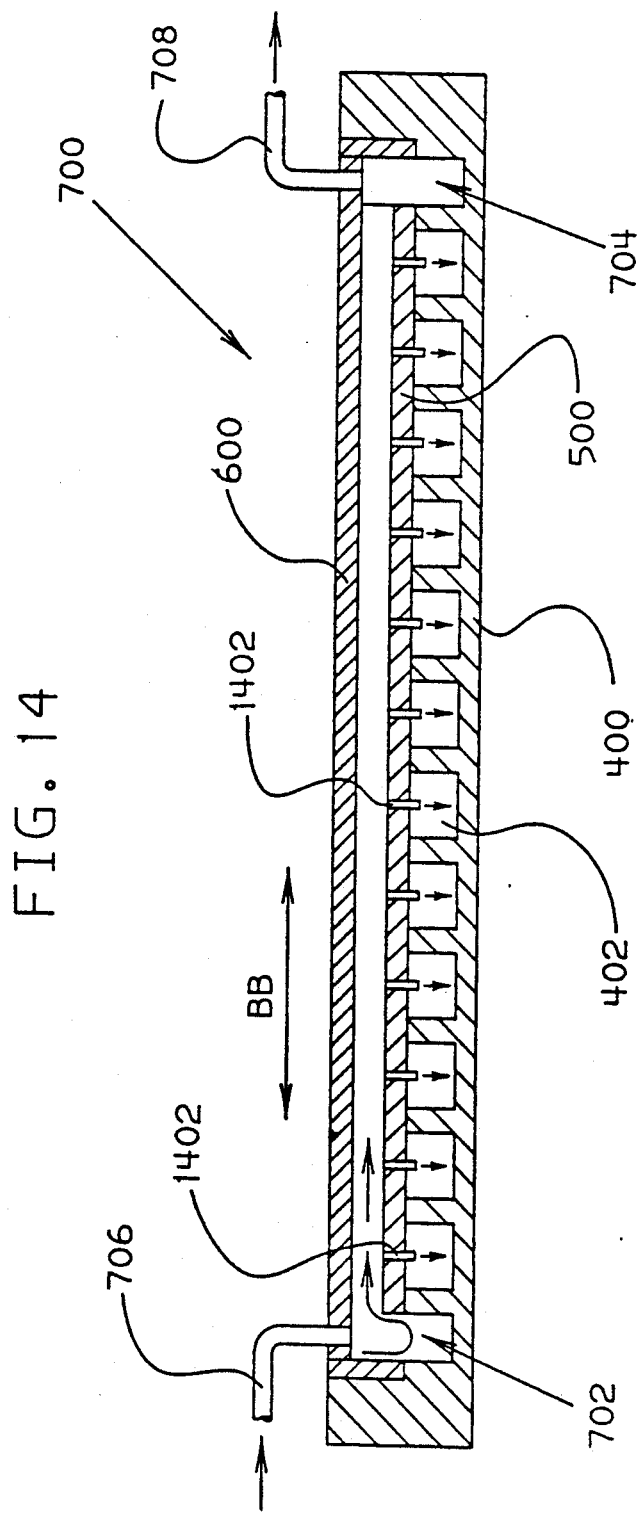
FIG. 14 is a side cutway view of a cold plate wherein the interposer plate is provided with nozzles that extend into the base plate channels.

In order to provide for optimization of impingement height and desired channel depth, the interposer plate can be provided with nozzles 1402 that extend into the base plate channels (FIG. 14). Thus, were the base plate channels extended to a depth of 8.0 mm, the interposer plate nozzles could extend 4.9 mm into the channels thus achieving the optimum 3.1 mm impingement distance while at the same time providing an extended cooling surface on the base plate.

As a further embodiment, filler materials (such as strip fins, pellets or screens) can be added to the distribution and/or base plate channels to enhance cooling.

Figure 8:
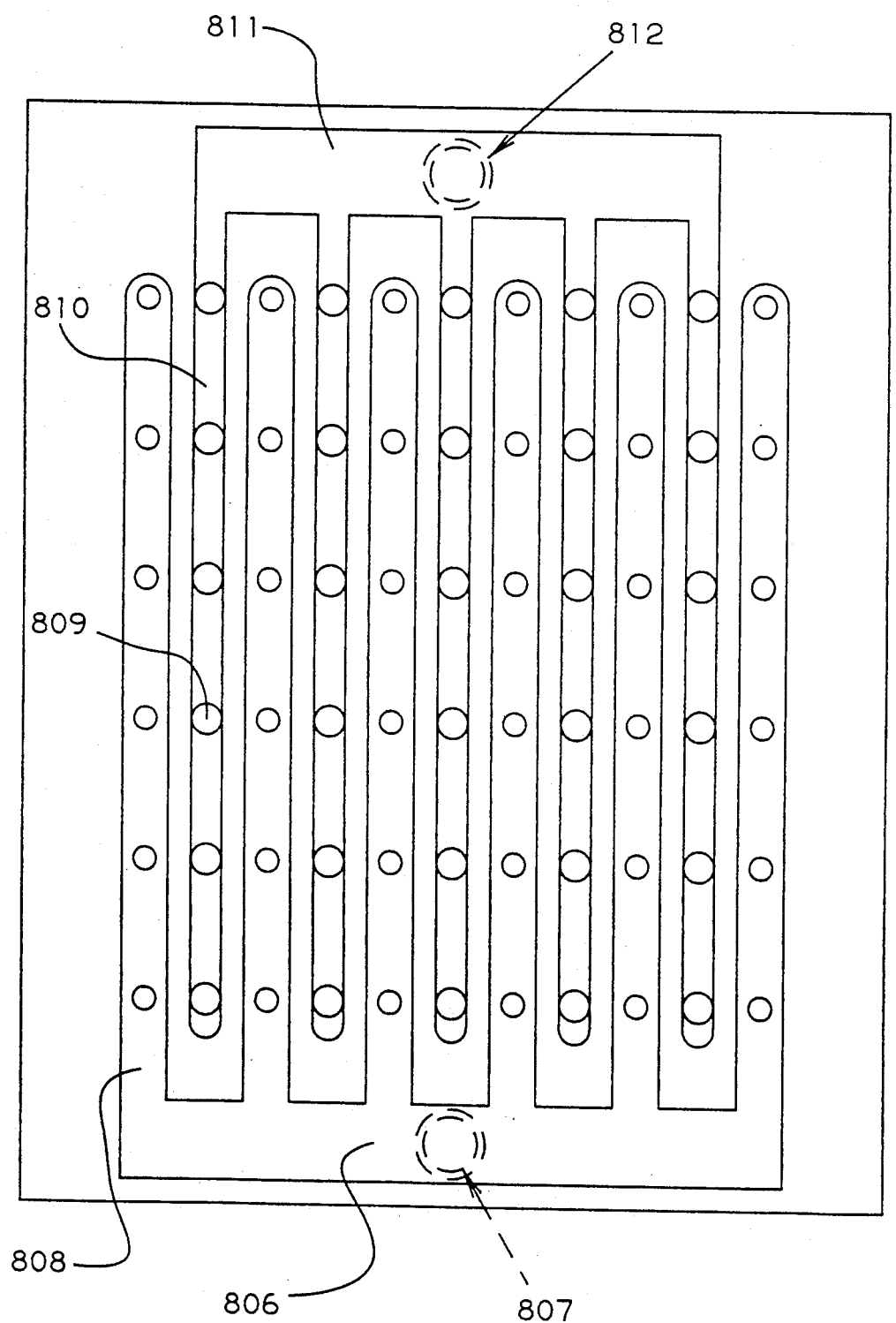
FIG. 8 is a top cutaway view of the distribution portion of the integrated circuit cooling module of FIG. 9.
Figure 9:
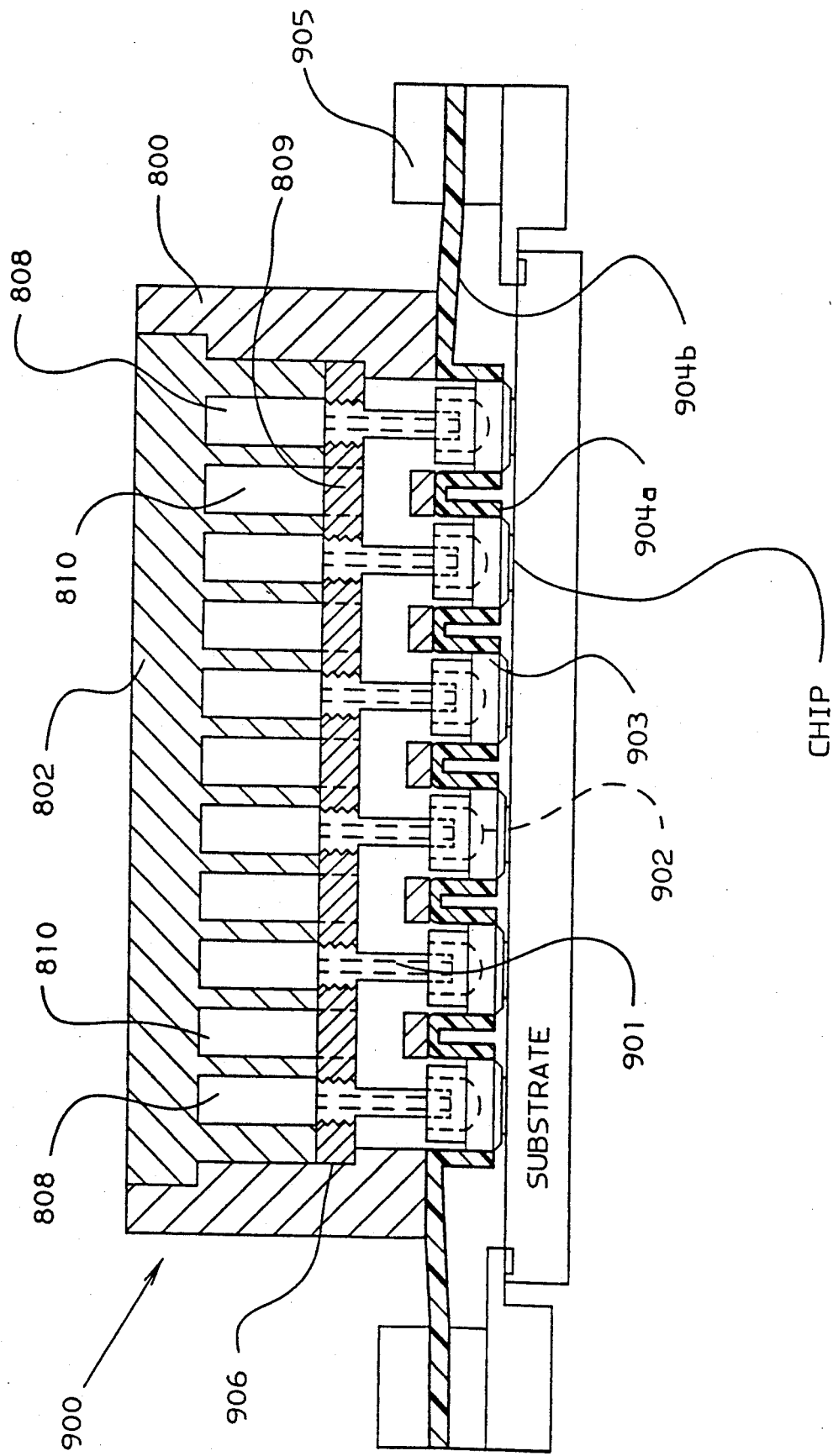
FIG. 9 is a side cutaway view of an integrated circuit cooling module using cross hatch flow distribution.

Another embodiment cross hatch flow distribution as applied to an integrated circuit cooling module 900 is illustrated in FIGS. 8 and 9. The cooling module of FIG. 9 comprises a body portion 800 and a distribution portion 802 which is preferably attached to the body by brazing. In the embodiment of FIGS. 8 and 9, the cooling fluid is forced, under pressure, to flow through an extended nozzle interposer plate 901 ultimately imposing into a spherical cavity 902 within a cooling plug 903. Extended tubes (or nozzles) 901 in the interposer plate 906 have openings directly over the cooling plugs 903. The cooling plugs 903 are attached to the cooling device by means of a compliant membrane 904a. This enables single plugs to conform to chip height and tilt variability across an entire module. In addition, an outer frame 905 is attached to the cooling devices by means of an another compliant membrane 904b, of the same type used to attach the cooling plugs 903. This outer membrane 904b provides for module global compliance in the z direction. Advantageously, the compliant membranes provide for a compliant integrated circuit chip interface without the need for pistons and springs.

The fluid flow scheme in the module of FIG. 9 will now be explained by reference to FIGS. 8 and 9. The cooling fluid (not shown) enters the inlet reservoir 806 (FIG. 8) through an inlet fitting or fittings 807. From the inlet manifold chamber 806, the fluid flows through a plurality of individual inlet channels 808. From the inlet channels, the fluid travels down the extended tubes 901 (FIG. 9) and impinges into the spherical cavities 902 within the cooling plugs 903. The geometry of the cavities 902 is such that the fluid is forced up and away from the plug once it impinges on the cavity base. The fluid exits through openings 809 in the interposer 900 which lie between the extended tube nozzles 901. The fluid travels through the openings 809 an enters the outlet channel 810 (FIG. 8). The fluid in the outlet channels then flows into the outlet manifold chamber 811 and finally exits the module through an outlet fitting or fittings 812.

The inlet and outlet channels are separated to assist in uniform or customized flow distribution (i.e. channel pitch, size, and high can vary to control flow rate as dictated by device power).

Figure 10:
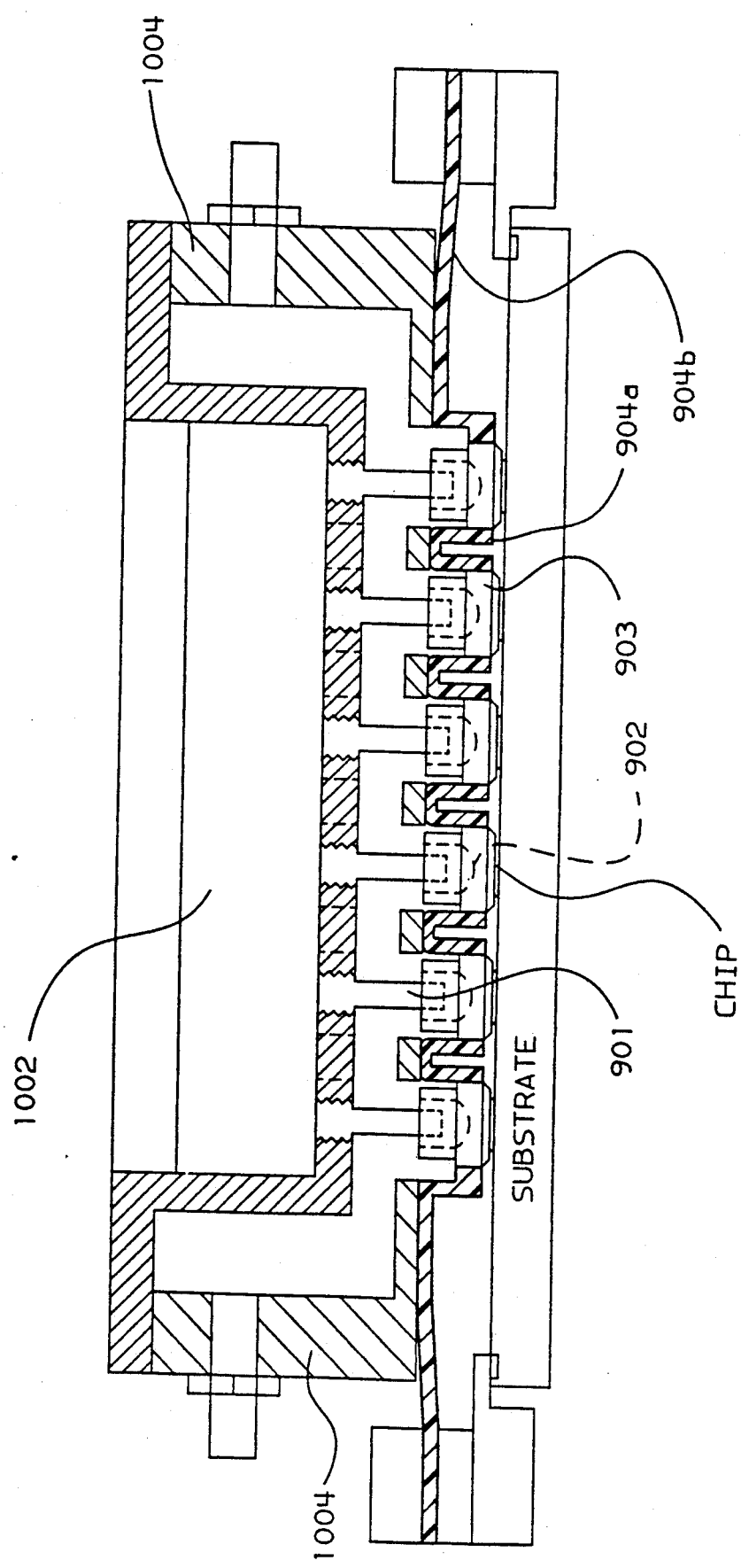
FIG. 10 illustrates an embodiment of the integrated circuit cooling module of FIG. 9, having a single large manifold.

In another embodiment, FIG. 10 depicts a module having a single large supply manifold 1002. This manifold structure supplies the extended tube nozzles with equal flow. The fluid exits by means of outlet ports 1004 located around the perimeter of the module.

Many modifications and improvements will now be come apparent to those of skill in the art. For example, the base, interposer and distribution plates could be made from a good heat conducting material other than copper. Further, the plates and openings could be formed by casting or stamping. Thus, it should be understood that the foregoing description has been provided by way of example and not as a limitation. The scope of the invention is defined by the following claims:

Having thus described our invention, what we claim as new and desire to secure by Letters Patent is:

1. A heat removal apparatus, comprising:
 a first plate having a plurality of inlet channels formed therein and a plurality of outlet channels formed therein and disposed so as to be interleaved with said inlet channels;
 a second plate having a plurality of cooling channels formed therein, said second plate being disposed in communication with said first plate such that said cooling channels are not parallel with said inlet channels and said outlet channels;
 a third plate, having a plurality of nozzles formed therein, said third plate being disposed between said first and second plates such that said nozzles align with said inlet channels;
 an inlet manifold chamber connected to supply a coolant to said inlet channels; and
 an outlet manifold chamber connected to receive said coolant from said outlet channels;
 wherein said inlet channels are of a depth that decreases with distance from said inlet manifold chamber.

2. The heat removal apparatus of claim 1 wherein said cooling channels are disposed so as to be essentially perpendicular with both said inlet channels and said outlet channels.

3. A heat removal apparatus, comprising:
 a first plate having a plurality of inlet channels formed therein and a plurality of outlet channels formed therein and disposed so as to be interleaved with said inlet channels;
 a second plate having a plurality of cooling channels formed therein, said second plate being disposed in communication with said first plate such that said cooling channels are not parallel with said inlet channels and said outlet channels; and
 a third plate, having a plurality of nozzles formed therein, said third plate being disposed between said first and second plates such that said nozzles align with said inlet channels;
 wherein said second plate comprises a plurality of bosses extending therefrom and wherein said third plate has a plurality of openings formed therein disposed to receive said bosses when said third plate is mounted to said second plate.

4. The heat removal apparatus of claim 1, wherein each of said first, second and third plates have manifold openings formed therein which cooperate to form said inlet manifold chamber and said outlet manifold chamber.

5. The heat removal apparatus of claim 1 wherein said nozzles extend into said cooling channels.

6. The heat removal apparatus of claim 1, wherein said nozzles are arranged into a plurality of parallel lines, said parallel lines being disposed perpendicular to said cooling channels and parallel with said inlet channels.

7. The heat removal apparatus of claim 9, wherein said third plate further comprises a plurality of elongated openings formed therein, interleaved with said lines.

8. The heat removal apparatus of claim 1, further comprising a plurality of inlet fittings connected to said inlet manifold chamber.

9. The heat removal apparatus of claim 1, further comprising an inlet fitting connected to said inlet manifold chamber and an outlet fitting connected to said outlet manifold chamber.

10. The heat removal apparatus of claim 9, wherein said inlet fitting is of substantially the same perimeter as said inlet manifold chamber and said outlet fitting is of substantially the same perimeter as said outlet manifold chamber.

11. The heat removal apparatus of claim 1, wherein said cooling plugs each have a spherical cavity formed therein and wherein said spherical cavity is disposed so as to receive coolant from at least one of said nozzles.

12. A heat removal apparatus, comprising:
 a body portion;
 a plurality of cooling plugs;
 a plurality of first compliant members connecting said cooling plugs to said body portion;
 a distribution portion, coupled to said body portion, said distribution portion comprising a coolant manifold, and a plurality of nozzles connected to receive coolant from said coolant manifold and extending into said cooling plugs.

an outer frame; and a second compliant member connecting said outer frame to said body portion.

13. The heat removal apparatus of claim 1 wherein said nozzles are disposed at an impingement distance of about 3.1 mm from a bottom surface of said cooling channels.

14. A heat removal apparatus, comprising:

a first plate having a plurality of inlet channels formed therein and a plurality of outlet channels formed therein and disposed to be interleaved with said inlet channels;

a second plate having a plurality of cooling channels formed therein, said second plate being disposed in communication with said first plate such that said cooling channels are not parallel with respect to said inlet channels and said outlet channels;

an inlet manifold chamber connected to supply a coolant to said inlet channels;

an outlet manifold chamber connected to receive said coolant from said outlet channels; and a plurality of extended nozzles disposed at least partially within each of said cooling channels and connected to receive said coolant from said inlet channels;

wherein said first and second plates cooperate to form a flow path from said inlet channels through said nozzles, into said cooling channels and to said outlet channels.

15. The heat removal apparatus of claim 14 wherein said cooling channels are disposed to be essentially perpendicular to said inlet channels and said outlet channels.

16. The heat removal apparatus of claim 12, wherein said coolant manifold comprises a plurality of coolant inlet channels connected to supply said coolant to said plurality of nozzles, and a plurality of coolant outlet channels interleaved with said coolant inlet channels.

* * * * *